United States Patent
Sun

(10) Patent No.: US 12,278,448 B2
(45) Date of Patent: Apr. 15, 2025

(54) NETWORK ELECTRICAL CONNECTOR WITH A GROUND SHEET PROVIDING ELECTROMAGNETIC INTERFERENCE PROTECTION

(71) Applicant: JESS-LINK PRODUCTS CO., LTD., New Taipei (TW)

(72) Inventor: Chi-Hsien Sun, New Taipei (TW)

(73) Assignee: JESS-LINK PRODUCTS CO., LTD., New Taipei (TW)

( * ) Notice: Subject to any disclaimer, the term of this patent is extended or adjusted under 35 U.S.C. 154(b) by 341 days.

(21) Appl. No.: 17/959,166

(22) Filed: Oct. 3, 2022

(65) Prior Publication Data

US 2024/0055808 A1 Feb. 15, 2024

(30) Foreign Application Priority Data

Aug. 15, 2022 (TW) .................................. 111130639

(51) Int. Cl.
*H01R 13/6581* (2011.01)
*H01R 13/6582* (2011.01)
(Continued)

(52) U.S. Cl.
CPC ..... *H01R 13/6581* (2013.01); *H01R 13/6582* (2013.01); *H01R 13/6583* (2013.01);
(Continued)

(58) Field of Classification Search
CPC ............ H01R 13/6581; H01R 13/6582; H01R 13/6583; H01R 13/6594; H01R 24/64;
(Continued)

(56) References Cited

U.S. PATENT DOCUMENTS

| 10,615,525 B1* | 4/2020 | Lin ................. H01R 13/6471 |
| 2007/0237489 A1* | 10/2007 | Sasser ................. G02B 6/4284 |
| | | 385/147 |
| 2015/0249237 A1* | 9/2015 | Naito ...................... H01R 12/58 |
| | | 429/7 |

FOREIGN PATENT DOCUMENTS

| CN | 2567804 Y | * | 8/2003 |
| CN | 101406111 A | | 4/2009 |

(Continued)

OTHER PUBLICATIONS

Search Report dated Jun. 29, 2023 of the corresponding European patent application No. 22200429.3.

(Continued)

*Primary Examiner* — Justin M Kratt
(74) *Attorney, Agent, or Firm* — Chun-Ming Shih; HDLS IPR SERVICES

(57) ABSTRACT

A network connector includes an insulative seat, conductive terminals, a control circuit module and a ground sheet. The control circuit module includes a circuit board and an electronic element. The circuit board includes first contacts and second contacts. The insulative seat is fixed on the circuit board. Each conductive terminal is electrically connected with each first contact. The electronic element is fixed on the circuit board and includes conductive pins. Each conductive pin is electrically connected with each second contact. The ground sheet is electrically connected to the circuit board and includes a positioning portion and an arm portion. The positioning portion is disposed between the first contact and the second contact. The arm portion is extended toward the first contact and passes through a position of the first contact.

11 Claims, 7 Drawing Sheets

(51) Int. Cl.
  *H01R 13/6583*  (2011.01)
  *H01R 13/6594*  (2011.01)
  *H01R 24/64*  (2011.01)
  *H01R 31/06*  (2006.01)
  *H05K 1/02*  (2006.01)
  *H01R 12/58*  (2011.01)
  *H01R 13/648*  (2006.01)
  *H01R 13/658*  (2011.01)
  *H01R 13/66*  (2006.01)
  *H01R 24/60*  (2011.01)
  *H01R 24/62*  (2011.01)
  *H05K 1/11*  (2006.01)
  *H05K 1/18*  (2006.01)

(52) U.S. Cl.
  CPC ......... *H01R 13/6594* (2013.01); *H01R 24/64* (2013.01); *H01R 31/065* (2013.01); *H05K 1/0216* (2013.01); *H01R 12/58* (2013.01); *H01R 13/648* (2013.01); *H01R 13/658* (2013.01); *H01R 13/665* (2013.01); *H01R 13/6658* (2013.01); *H01R 24/60* (2013.01); *H01R 24/62* (2013.01); *H01R 31/06* (2013.01); *H01R 2201/04* (2013.01); *H05K 1/0215* (2013.01); *H05K 1/117* (2013.01); *H05K 1/18* (2013.01); *H05K 1/181* (2013.01); *H05K 1/182* (2013.01); *H05K 2201/10189* (2013.01); *H05K 2201/10371* (2013.01)

(58) Field of Classification Search
  CPC .... H01R 31/065; H01R 12/58; H01R 13/648; H01R 13/658; H01R 13/665; H01R 13/6658; H01R 24/60; H01R 24/62; H01R 31/06; H01R 2201/04; H05K 1/0216; H05K 1/0215; H05K 1/117; H05K 1/18; H05K 1/181; H05K 1/182; H05K 2201/10189; H05K 2201/10371
  See application file for complete search history.

(56) References Cited

FOREIGN PATENT DOCUMENTS

| CN | 204179386 U | 2/2015 |
|----|-------------|--------|
| TW | M635760 U | 12/2022 |
| WO | 2015026926 A1 | 2/2015 |

OTHER PUBLICATIONS

Office Action dated Feb. 14, 2023 of the corresponding Taiwan patent application No. 111130639.

\* cited by examiner

NETWORK ELECTRICAL CONNECTOR WITH A GROUND SHEET PROVIDING ELECTROMAGNETIC INTERFERENCE PROTECTION

BACKGROUND

Technical Field

The disclosure relates to an electric connector technology, particularly to a network connector.

Description of Related Art

Electromagnetic interference (EMI) is spillover of electromagnetic waves generated by electronic equipment such as computers, smartphones or other electric apparatuses. Electromagnetic waves generated by current or electromagnetic induction may spill over to the surroundings to affect users or interfere with operation or measurement accuracy of other devices in the place if there is no anti-EMI design in an electric product.

Network connectors are used to serve as a communicating bridge between computers and external network. General network connectors such as RJ45 connectors are applied in digital communication. With the compactness of the internal space of a computer, the signal interference caused by the electromagnetic effect must be considered. There are two primary reasons of noise interference which affects a network connector, one is the EMI around the connector, and the other one is the internal interference of the connector. As a result, such a network connector may easily generate high-frequency waves which interferes the other electric devices, and signals of the connector may also be affected by noises generated by external transmission lines.

In view of this, the inventors have devoted themselves to the above-mentioned related art, researched intensively and cooperated with the application of science to try to solve the above-mentioned problems. Finally, the invention which is reasonable and effective to overcome the above drawbacks is provided.

SUMMARY

An object of the disclosure is to provide a network connector, which uses a ground sheet to guide the signals entering a circuit board before the signals reach the electronic elements, so as to effectively reduce the EMI interference.

To accomplish the above object, the disclosure provides a network connector including an insulative seat, multiple conductive terminals, a control circuit module and a ground sheet. Each conductive terminal is spacedly arranged and fixed on the insulative seat. The control circuit module includes a circuit board and at least one electronic element. The circuit board includes multiple first contacts and multiple second contacts electrically connected with the first contacts. Each first contact is disposed on an end of the circuit board. Each second contact is arranged corresponding to each first contact at intervals. The insulative seat is fixed on the circuit board. Each conductive terminal is electrically connected with each first contact. The electronic element is fixed on the circuit board and includes multiple conductive pins. Each conductive pin is electrically connected with each second contact. The ground sheet is electrically connected to the circuit board and includes a positioning portion and at least one arm portion connected with the positioning portion. The positioning portion is disposed between each first contact and each second contact. The arm portion is extended toward each first contact and passes through a position of each first contact.

The disclosure further has the following function. By the metal casing covering each component and being electrically connected with the ground sheet, the desirable effect of electromagnetic shielding may be obtained.

DETAILED DESCRIPTION

The technical contents of this disclosure will become apparent with the detailed description of embodiments accompanied with the illustration of related drawings as follows. It is intended that the embodiments and drawings disclosed herein are to be considered illustrative rather than restrictive.

Figure 1:
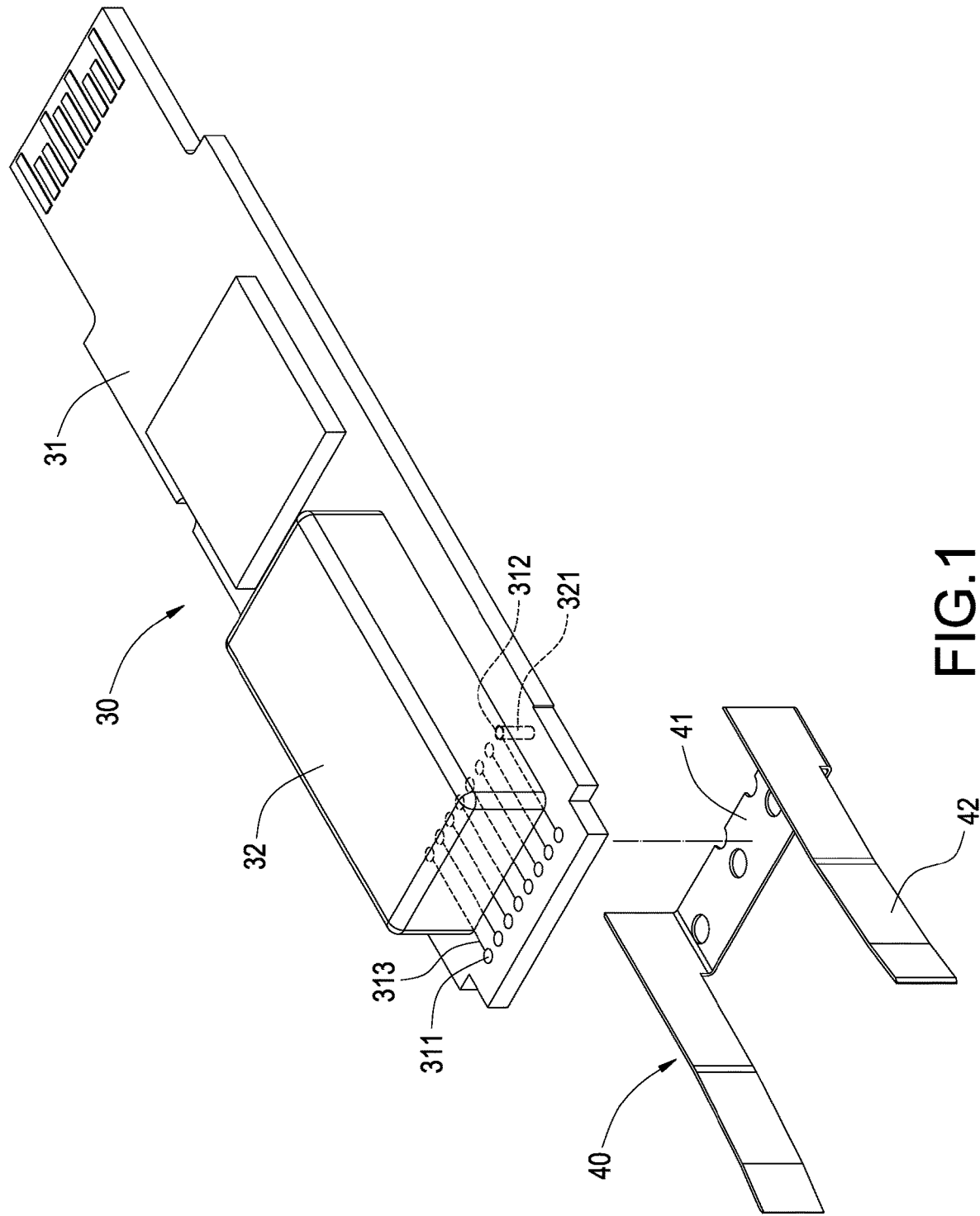
FIG. 1 is an exploded view of the control circuit module and the ground sheet of the disclosure.
Figure 2:
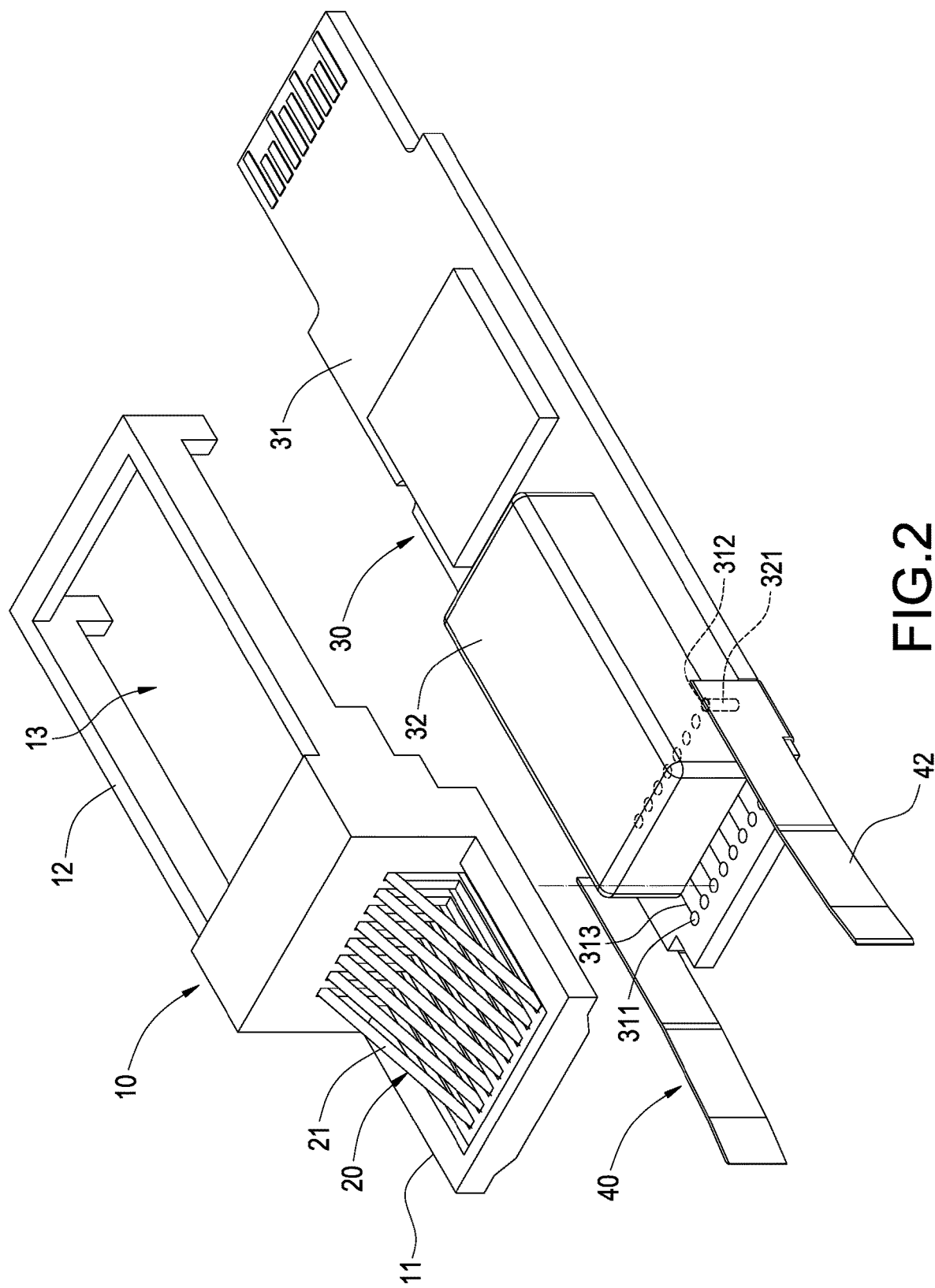
FIG. 2 is an exploded view of the insulative seat and the conductive terminals which have been assembled and the control circuit module and the ground sheet which have been assembled.
Figure 3:
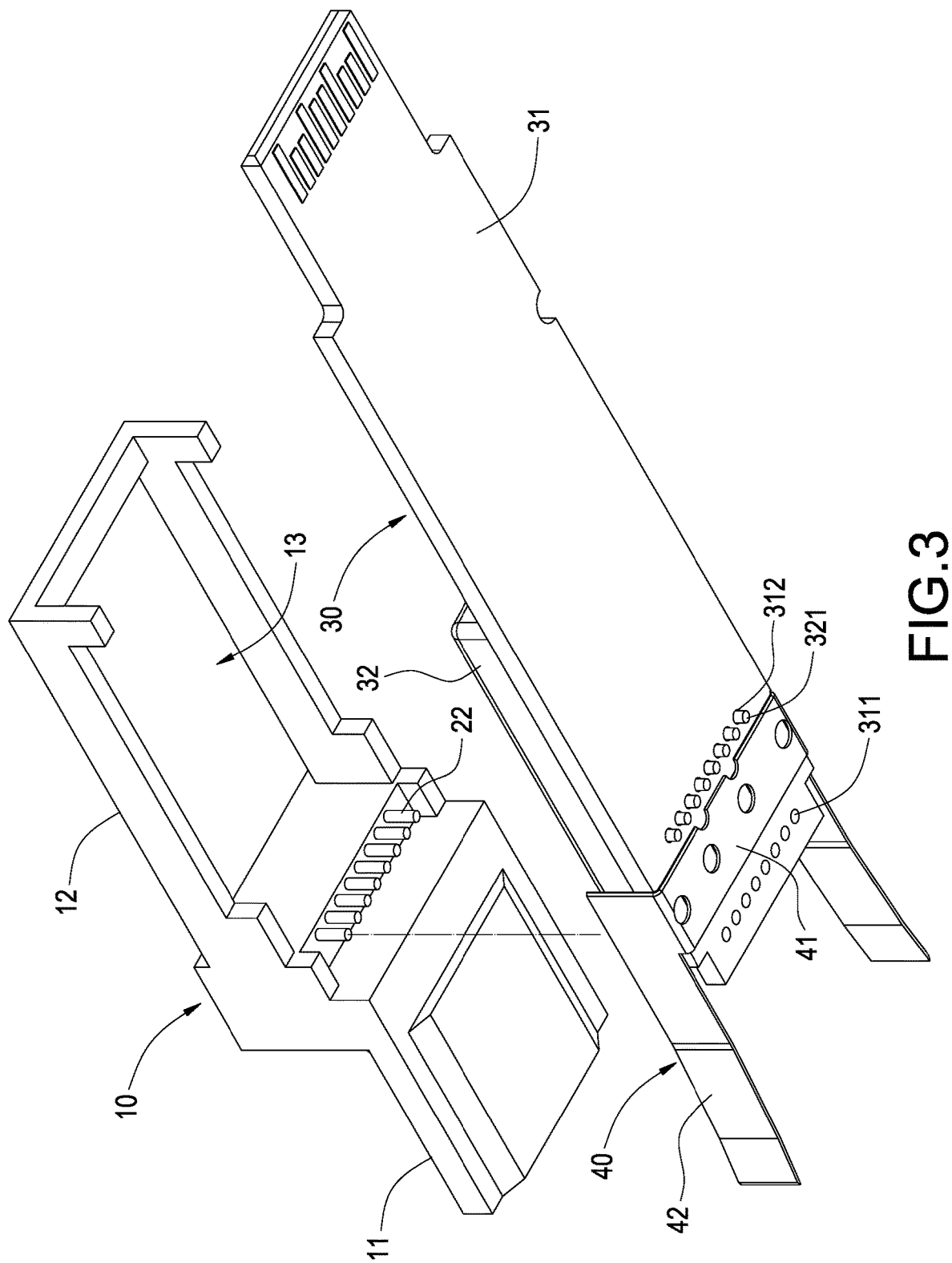
FIG. 3 is a view of FIG. 2 at another view point.

Please refer to FIGS. 1-3. The disclosure provides a network connector, which includes an insulative seat 10, multiple conductive terminals 20, a control circuit module 30 and a ground sheet 40.

The insulative seat 10 is made of a material with desirable insulation, such as plastic, and includes a terminals base 11 and a frame 12 rearward extended from the terminals base 11. A receiving recess 13 is formed in the frame 12.

Each conductive terminal 20 is made of a material with desirable conductivity, such as copper or its alloy. Each conductive terminal 20 is fixed on the insulative seat 11 in a row at intervals. Part of each conductive terminal 20 is covered by the insulative seat 10, the other parts, which are non-covered, are separately formed to be an abutting section 21 and a soldering section 22. The abutting section 21 is used for connecting a mated connector (not shown in figures).

The control circuit module 30 includes a circuit board 31 and at least one electronic element 32. The circuit board 31 of the embodiment is substantially an elongated rectangular board and includes multiple first contacts 311, multiple second contacts 312 and multiple copper foil circuits 313. Each first contact 311 is disposed on an end of the circuit board 31. Each second contact 312 is arranged corresponding to each first contact 311 at intervals on the circuit board 31. Each second contact 312 is located on rear position of each first contact 311 (i.e., in comparison with each first contact 311, each second contact 312 is located away from the end of the circuit board 31). Each copper foil circuit 313 is electrically connected with each first contact 311 and each second contact 312. The insulative seat 10 is fixed on the circuit board 31. The soldering section 22 of each conductive terminal 20 is electrically connected with each first contact 311 correspondingly.

The electronic element 32 may be a microprocessor, a control chip or an integrated circuit (IC). The electronic element 32 is fixed on the circuit board 31 and includes multiple conductive pins 321. Each conductive pin 321 is electrically connected with each second contact 312 correspondingly. The electronic element 32 is received in the frame 12 corresponding to the receiving recess 13.

The ground sheet 40 is electrically connected to the circuit board 31 and is made of a material with desirable conductivity, such as copper or an alloy thereof. The ground sheet 40 includes a positioning portion 41 and at least one arm portion 42 connected with the positioning portion 41. The positioning portion 41 is disposed under the circuit board 31 and between each first contact 311 and each second contact 312. The arm portion 42 is extended toward each first contact 311 and passes through a position of each first contact 311. The ground sheet 40 is connected on the circuit board 31 by the surface mounting technology (SMT). One of the copper foil circuits 313 is electrically connected to the positioning portion 41 of the ground sheet 40.

In an embodiment, the number of the arm portions 42 may be two. The arm portions 42 are extended from two sides of the circuit board 31 and pass through a position of each first contact 311.

Figure 4:
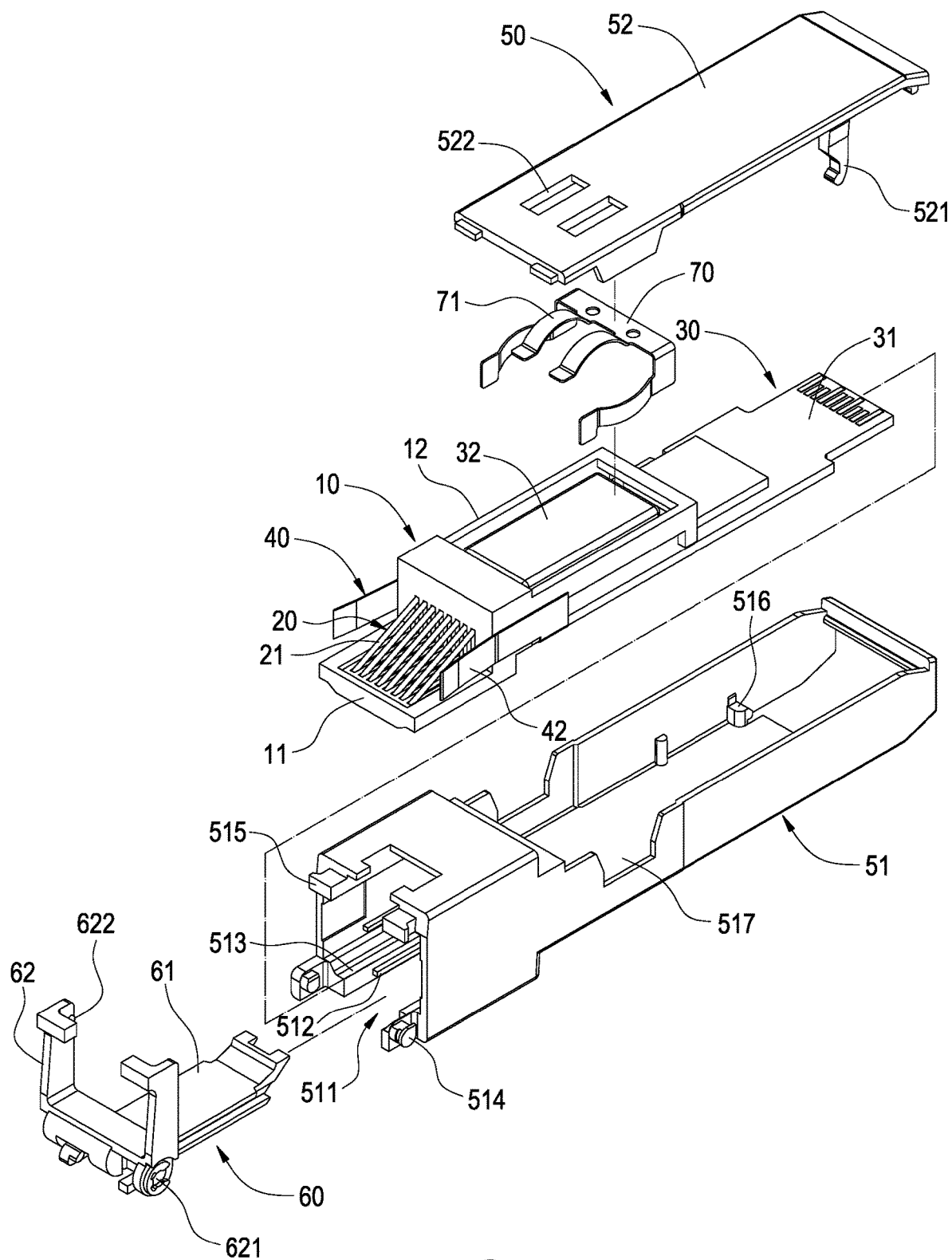
FIG. 4 is an exploded view of the network connector of the disclosure.
Figure 5:
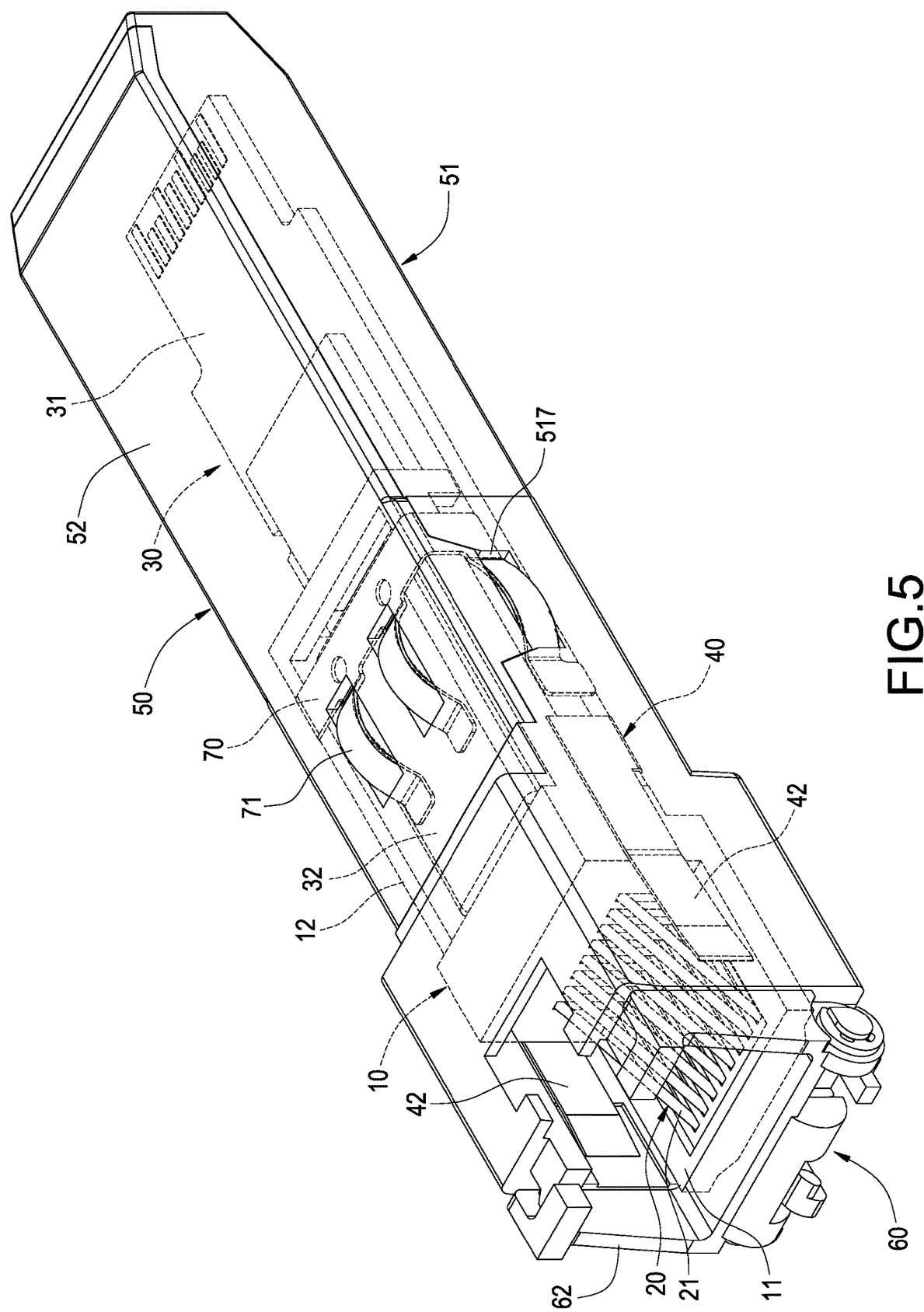
FIG. 5 is an assembled see-through view of the network connector of the disclosure.
Figure 6:
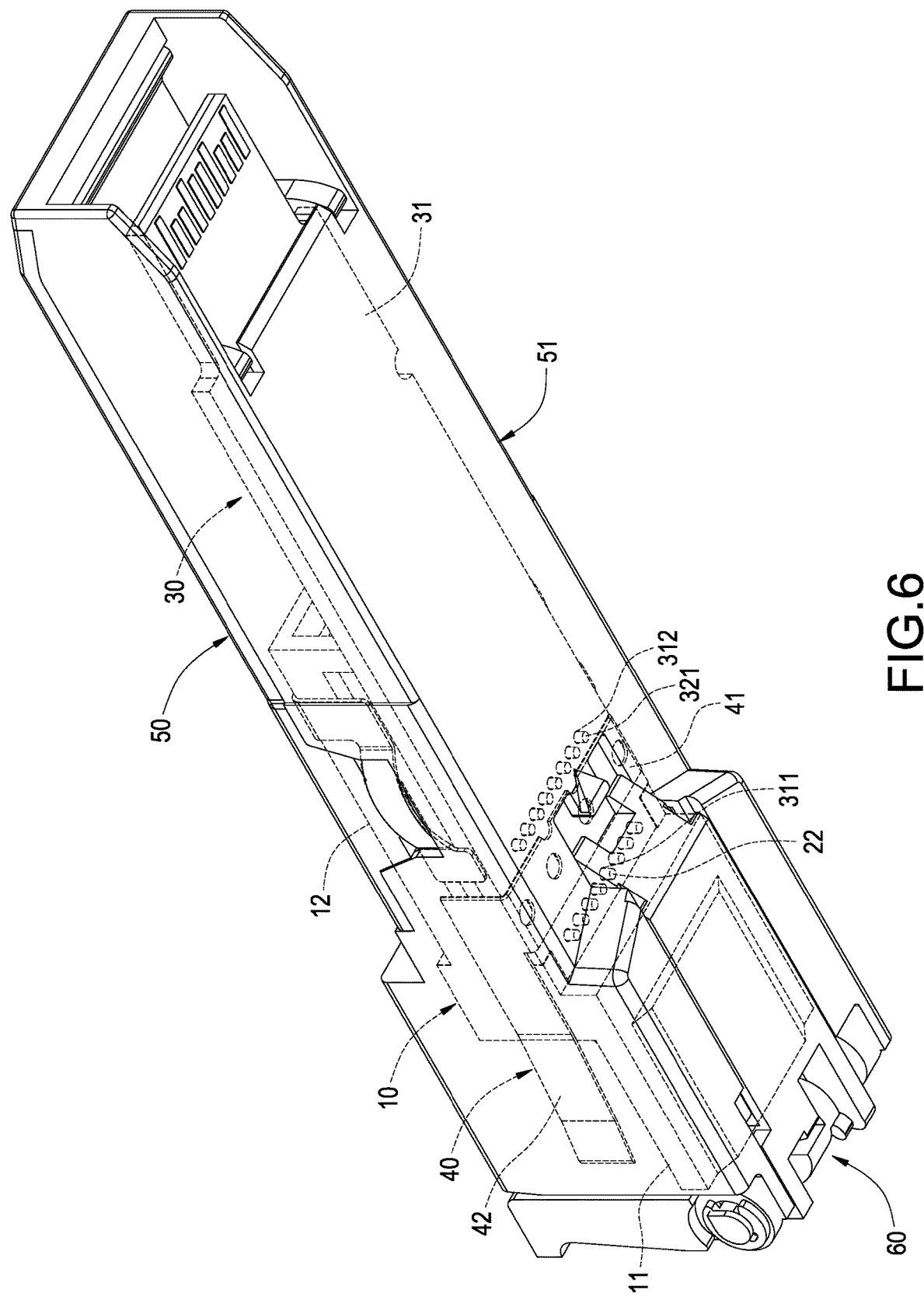
FIG. 6 is a view of FIG. 5 at another view point.

Please refer to FIGS. 4-6. In an embodiment, the network connector of the disclosure further includes a metal casing 50 covering the insulative seat 10, each conductive terminal 20, the control circuit module 30 and the ground sheet 40, and conductively contacting a free end of the ground sheet 40. The metal casing 50 includes a lower casing 51 and an upper casing 52. The lower casing 51 has an opening 511. The inside of the opening 511 is disposed with two guiding rails 512 corresponding to each other. Two sliding rails 513 corresponding to each other are disposed over the guiding rails 512. The opening 511 is used to accommodate the insulative seat 10, each conductive terminal 20, the control circuit module 30 and the ground sheet 40. Each sliding rail 513 is used to be slidably connected with the insulative seat 10.

In an embodiment, the network connector of the disclosure further includes a front frame 60 connected with the metal casing 50 corresponding to the opening 511. The front frame 60 includes an embedding plate 61 and a bracket 62 connected with the embedding plate 61. The bracket 62 is substantially of a U-shape, the bottom of the bracket 62 is provided with two engaging troughs 621 corresponding to each other, and the top of the bracket 62 is provided with two engaging bumps 622 corresponding to each other. Bottom of the front edge of the opening 511 of the lower casing 51 is provided with two engaging bars 514 corresponding to each other, and top of the front edge of the opening 511 is provided with two engaging blocks 515 corresponding to each other. After the embedding plate 61 is inserted into the opening 511, each engaging trough 621 is engaged and connected with each engaging bar 514, and each engaging block 515 is fixed and connected with each engaging bump 622.

In an embodiment, the upper casing 52 covers the lower casing 51 correspondingly. The rear section of the upper casing 52 is disposed with two clamping arms 521 corresponding to each other, and the inside of the rear section of the lower casing 51 is disposed with two clamping hooks 516 corresponding to each other. Each clamping arm 521 is engaged and connected with each clamping hook 516.

In an embodiment, the network connector of the disclosure further includes an elastic claw 70 which is fixed on the frame 12 of the insulative seat 10 and exposed from the metal casing 50 externally. The elastic claw 70 includes multiple arcuate elastic arms 71. The middle section of the lower casing 51 is provided with two notches 517 corresponding to each other. The upper casing 52 is provided with two passing troughs 522. Each arcuate elastic arm 71 is exposed from the metal casing 50 externally through each notch 517 and each passing trough 522.

Figure 7:
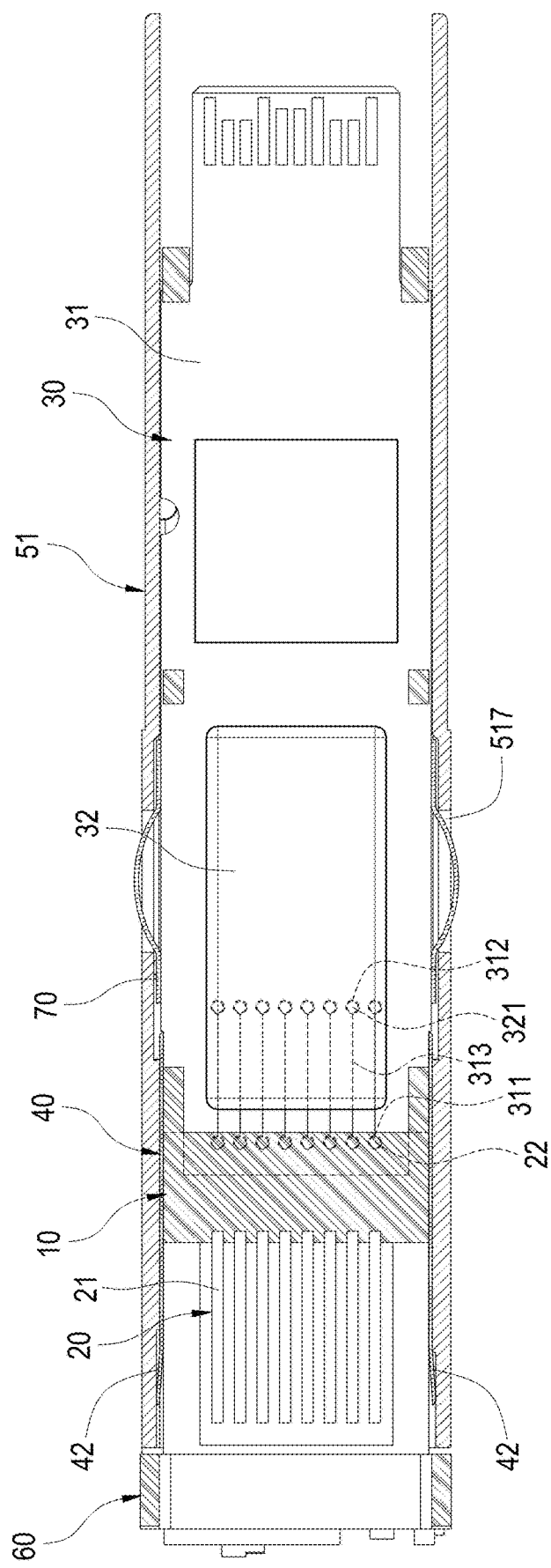
FIG. 7 is a cross-sectional view of the network connector of the disclosure.

Please refer to FIG. 7. When the external network is electrically connected to each conductive terminal 20 through a preset plug, its network signals are transmitted from each conductive terminal 20 to each first contact 311 of the circuit board 31 and then transmitted from each copper foil circuit 313 to each second contact 312 on the rear side. By the positioning portion 41 of ground sheet 40 being disposed between each first contact 311 and each second contact 312, and the arm portions 42 being extended from two sides of the circuit board 31 and passing through the position of each first contact 311, unnecessary noise may be guided out and carried out of each first contact 311 through each arm portion 42. Also, by the electric connection between the free end of each arm portion 42 and the metal casing 50, the desirable effect of electromagnetic shielding may be obtained. By the practically useful signals after the filtering of the ground sheet 40, data in the network signals may be extracted by the electronic element 32 to be converted and processed, and finally, output to a data processing system in a serial data transmission manner to be processed.

While this disclosure has been described by means of specific embodiments, numerous modifications and variations could be made thereto by those skilled in the art without departing from the scope and spirit of this disclosure set forth in the claims.

What is claimed is:

1. A network connector comprising:
an insulative seat;
multiple conductive terminals, spacedly arranged and fixed on the insulative seat;
a control circuit module, comprising a circuit board and at least one electronic element, the circuit board comprising multiple first contacts and multiple second contacts electrically connected with the first contacts, each first contact disposed on an end of the circuit board, each second contact arranged spacedly corresponding to each first contact, the insulative seat fixed on the circuit board, each conductive terminal electrically connected with each first contact, the electronic element fixed on the circuit board and comprising multiple conductive pins, and each conductive pin electrically connected with each second contact;
a ground sheet, electrically connected to the circuit board, comprising a positioning portion and at least one arm portion connected with the positioning portion, the positioning portion disposed between each first contact and each second contact, and the arm portion extended toward each first contact and passing through a position of each first contact;
a metal casing covering the insulative seat, each conductive terminal, the control circuit module and the ground sheet, and contacting the ground sheet; and
an elastic claw fixed on the insulative seat and exposed from the metal casing,
wherein the elastic claw comprises multiple arcuate elastic arms, the metal casing comprises a lower casing and an upper casing corresponding to the lower casing, the lower casing comprises multiple notches, the upper casing comprises multiple passing troughs, and each arcuate elastic arm is exposed from the metal casing through each notch and each passing trough.

2. The network connector of claim 1, wherein the electronic element comprises a microprocessor, a control chip and an integrated circuit (IC).

3. The network connector of claim 1, wherein the arm portion is multiple in number, and each arm portion is extended along two sides of the circuit board and passes through the position of each first contact.

4. The network connector of claim 1, wherein the circuit board comprises multiple copper foil circuits, each copper foil circuit is electrically connected with each first contact and each second contact, and the positioning portion is disposed under the circuit board and electrically connected with one of the copper foil circuits.

5. The network connector of claim 1, wherein the lower casing contacts the ground sheet.

6. The network connector of claim 5, wherein the upper casing comprises multiple clamping arms, and the lower casing comprises multiple clamping hooks engaged and connected with the clamping arms.

7. The network connector of claim 5, wherein the lower casing comprises an opening, multiple sliding rails are disposed inside the opening, the opening is configured to accommodate the insulative seat, each conductive terminal, the control circuit module and the ground sheet after being assembled, and each sliding rail is configured to be slidably connected with the insulative seat.

8. The network connector of claim 1, further comprising: a front frame, wherein the lower casing comprises an opening, and the front frame is connected with the metal casing corresponding to the opening.

9. The network connector of claim 8, wherein the front frame comprises an embedding plate and a bracket connected with the embedding plate, the bracket comprises multiple engaging troughs, and the lower casing comprises multiple engaging bars disposed on a front edge of the opening and engaged with and fixed to the engaging troughs.

10. The network connector of claim 9, wherein the bracket comprises multiple engaging bumps, and the lower casing comprises multiple engaging blocks disposed on a front edge of the opening and fixed and connected to the engaging bumps.

11. The network connector of claim 1, wherein the insulative seat comprises a terminals base and a frame extended from the terminals base, the frame comprises a receiving recess, each conductive terminal is fixed on the terminals base, and the electronic element is accommodated in the frame corresponding to the receiving recess.

* * * * *